(12) United States Patent
Ritter et al.

(10) Patent No.: US 8,902,588 B2
(45) Date of Patent: Dec. 2, 2014

(54) SET-TOP BOX HAVING MICROPERFORATIONS

(75) Inventors: Darin Bradley Ritter, Indianapolis, IN (US); Mickey Jay Hunt, Camby, IN (US); Mark William Gysin, Noblesville, IN (US)

(73) Assignee: Thomson Licensing, Issy les Moulineaux (FR)

( * ) Notice: Subject to any disclaimer, the term of this patent is extended or adjusted under 35 U.S.C. 154(b) by 146 days.

(21) Appl. No.: 13/514,699

(22) PCT Filed: Dec. 2, 2010

(86) PCT No.: PCT/US2010/003080
§ 371 (c)(1),
(2), (4) Date: Jun. 8, 2012

(87) PCT Pub. No.: WO2011/071516
PCT Pub. Date: Jun. 16, 2011

(65) Prior Publication Data
US 2012/0243176 A1    Sep. 27, 2012

Related U.S. Application Data

(60) Provisional application No. 61/283,815, filed on Dec. 9, 2009.

(51) Int. Cl.
*H05K 7/20* (2006.01)

(52) U.S. Cl.
CPC .................. *H05K 7/20445* (2013.01)
USPC ........... 361/692; 361/690; 361/704; 361/719; 165/185

(58) Field of Classification Search
USPC ......... 361/690, 692, 709–710, 719–720, 816, 361/818; 165/185; 725/151
See application file for complete search history.

(56) References Cited

U.S. PATENT DOCUMENTS

| | | |
|---|---|---|
| 4,887,147 A | 12/1989 | Friedman |
| 5,620,242 A | 4/1997 | Leon et al. |
| 5,917,236 A | 6/1999 | Leader, III et al. |
| 6,021,044 A | 2/2000 | Neville, Jr. et al. |
| 6,049,469 A | 4/2000 | Hood, III et al. |
| 6,411,507 B1 | 6/2002 | Akram |
| 6,524,361 B1 | 2/2003 | Thornton et al. |
| 6,567,360 B1 | 5/2003 | Kagawa |
| 6,735,085 B2 | 5/2004 | McHugh et al. |
| 7,158,380 B2 | 1/2007 | Green et al. |
| 7,450,387 B2 | 11/2008 | Cheng et al. |
| 7,518,875 B2 | 4/2009 | Desrosiers et al. |
| 7,791,874 B2 * | 9/2010 | Reents et al. ............ 361/679.46 |
| D631,449 S * | 1/2011 | Ritter et al. ................. D14/125 |

(Continued)

FOREIGN PATENT DOCUMENTS

| | | |
|---|---|---|
| CN | 1814339 A | 8/2006 |
| CN | 201515429 | 6/2010 |

(Continued)

*Primary Examiner* — Robert J Hoffberg
(74) *Attorney, Agent, or Firm* — Robert D. Shedd; Richard LaPeruta (57) ABSTRACT

The set-top box includes an outer casing having micro-perforations, an interior bottom frame having a centrally located heatsink, a circuit board on the bottom frame and a louvered heatsinking element over the circuit board and in thermal contact with the heatsink.

20 Claims, 10 Drawing Sheets

(56) References Cited

U.S. PATENT DOCUMENTS

| | | | |
|---|---|---|---|
| 8,009,426 B2* | 8/2011 | Ahmad-Taylor et al. | 361/692 |
| 2002/0051338 A1 | 5/2002 | Jiang et al. | |
| 2003/0178627 A1 | 9/2003 | Marchl et al. | |
| 2005/0111195 A1 | 5/2005 | Wu | |
| 2005/0128710 A1 | 6/2005 | Beitelmal et al. | |
| 2005/0248923 A1 | 11/2005 | Hsu | |
| 2006/0148295 A1 | 7/2006 | Reents et al. | |
| 2006/0187643 A1 | 8/2006 | Tsurufusa | |
| 2006/0187645 A1 | 8/2006 | Numata | |
| 2006/0215357 A1 | 9/2006 | Green et al. | |
| 2007/0053513 A1 | 3/2007 | Hoffberg | |
| 2007/0177356 A1 | 8/2007 | Panek | |
| 2009/0148638 A1 | 6/2009 | Kishi et al. | |
| 2010/0073881 A1 | 3/2010 | Williams | |
| 2010/0097768 A1 | 4/2010 | Ishii et al. | |
| 2012/0140417 A1 | 6/2012 | Aspas Puertolas et al. | |
| 2013/0347051 A1* | 12/2013 | Bose et al. | 725/151 |

FOREIGN PATENT DOCUMENTS

| | | |
|---|---|---|
| EP | 1 248 507 A1 | 4/2001 |
| FR | 2 875 917 A1 | 9/2004 |
| GB | 2 355 017 A | 11/2001 |
| JP | 06-227553 | 8/1994 |
| JP | 07-059124 | 3/1995 |
| JP | 10-004281 | 1/1998 |
| JP | 2000269675 A | 9/2000 |
| JP | 2001358482 A | 12/2001 |
| JP | 2003017143 A | 1/2003 |
| JP | 2009141160 | 6/2009 |
| WO | 2011/071516 A1 | 6/2001 |
| WO | 2007/089321 A2 | 8/2007 |
| WO | 2007/109216 A1 | 9/2007 |
| WO | 2009057124 A2 | 5/2009 |
| WO | 2010118971 A1 | 10/2010 |
| WO | 2011106082 A1 | 9/2011 |
| WO | 2011146302 A1 | 11/2011 |

* cited by examiner

SET-TOP BOX HAVING MICROPERFORATIONS

CROSS-REFERENCE TO RELATED APPLICATIONS

This application claims the benefit, under 35 U.S.C. §365 of International Application PCT/US2010/003080, filed Dec. 2, 2010 which was published in accordance with PCT Article 21(2) on Jun. 16, 2011 in English and which claims the benefit of U.S. provisional patent application No. 61/283,815, filed Dec. 9, 2009.

FIELD OF THE INVENTION

The present invention relates to set-top boxes.

BACKGROUND OF THE INVENTION

Set-top boxes continue to be in high demand and an ever increasing need exists to reduce the size and improve aesthetic appeal, performance, and robustness of these devices and the like.

Particular problem that set-top boxes face are damage due to liquid entry, insect entry, and heat generation. However, venting apertures, which are often used for heat dissipation, unfortunately increase the opportunity of liquid and insect entry. As such, a need exists to address each of these problems without creating or augmenting other problems.

An additional consideration in designing set-top boxes to keep in mind is the consumer preference for smaller set-top boxes that are quiet, attractive, and mechanically and electrically robust. Because heat dissipation fans, which would tend improve electrical robustness of the set-top boxes, introduce noise and increase size of set-top boxes, a need exists for a design which can be robust but yet meet consumer preference.

SUMMARY OF THE INVENTION

An electronic device having features that remove heat and prevent liquid and insect entry comprises an outer casing having a top and a bottom in which the outer casing has heat venting perforations on any of its sides. The device further includes a bottom frame inside the outer casing in which the bottom frame has a heatsink surrounded by a peripheral area and the heatsink can be raised with respect to the peripheral area, wherein the peripheral area can have apertures. An interior electronic component or circuit board is over the bottom frame and a heatsinking element can be over the interior electronic component. The heatsinking element can have a central region in thermal contact with the heatsink and a peripheral portion in which the peripheral portion has louvers, wherein the central region can be depressed with respect to the peripheral portion and the interior electronic component or circuit board has a thermal contact region that permits the heatsink and central region to be in thermal contact. The louvers can be oriented in more than one direction and can be oriented to be directed toward the front, back, and sides of the device. The bottom frame can have two opposing sidewalls each having openings and clasps adjacent to the openings, wherein the openings are designed to accommodate engagement members of exterior end caps of the device. The engagement members engage the clasps through the openings which locks the end caps to the bottom frame and wherein the clasps can be narrower than the engagement members along a vertical dimension. The bottom frame can also have a rear wall having unlocking apertures adapted to permit unlocking prongs of a disengagement tool to enter therethrough and release the engagement members from the clasps, thereby permitting the ends caps to be unlocked from the bottom frame. The perforations of the casing can have opening dimensions in the range of 0.5 to 1 mm. Additionally, the heat removing features which include the heatsink, heatsink element, and perforations are designed to work without the need for a fan. The heat removing features can be enhanced by providing a base stand that permits the device stand vertically such that that the top and the bottom of the outer casing are oriented vertically.

BRIEF DESCRIPTION OF THE DRAWINGS

The invention will now be described by way of example with reference to the accompanying figures of which.

DETAILED DESCRIPTION OF THE EMBODIMENTS

The set-top box 30 or the like according to the invention includes outer casing 31 having micro-perforations 36, an interior bottom frame 10 having a centrally located heatsink 11, a circuit board 24 or the like on the bottom frame 10, and a louvered heatsinking element 20 over the circuit board 24 and in thermal contact with the heatsink 11.

Figure 1:
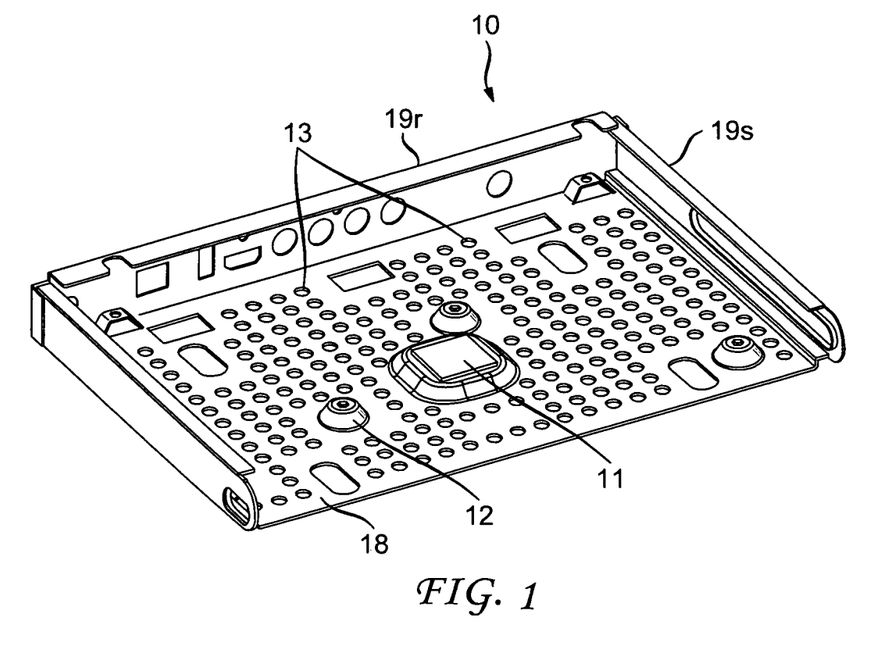
FIG. 1 shows an interior bottom frame 10 having a centrally located heatsink 11 according to the invention.

FIG. 1 shows the interior bottom frame 10 of the set-top box 30 having the centrally located heatsink 11. The heatsink 11 can be somewhat off center and is preferably raised from the base portion 18 of the frame 10. The frame 10 can also have upstanding sidewalls 19s, a rearwall 19r, spacers 12 for supporting internal components, and apertures 13 for improved heat flow and distribution.

Figure 2:
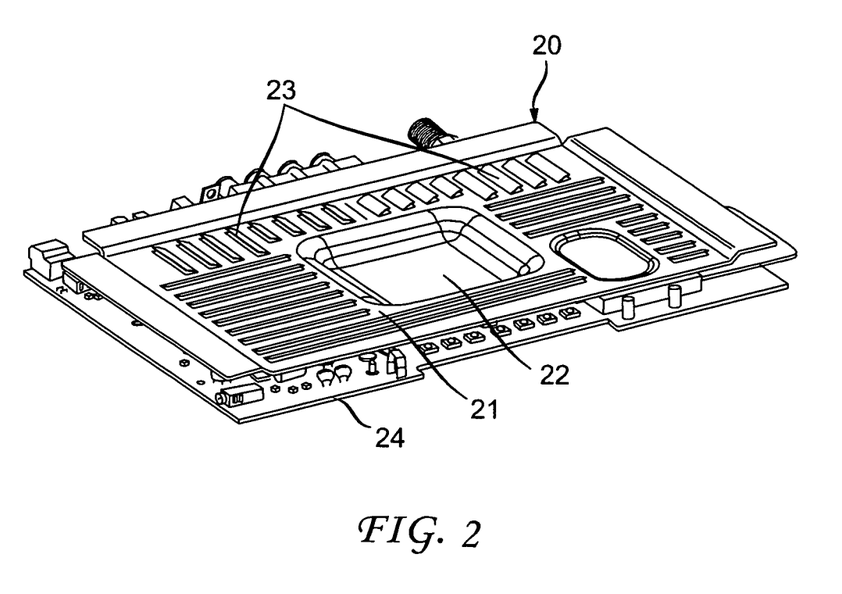
FIG. 2 shows a louvered heatsinking element 20 having a raised portion 21 and central lower region 22 according to the invention.

FIG. 2 shows a louvered heatsinking element 20 which is to be mounted parallel to the base portion 18 of the interior bottom frame 10 and preferably over the frame 10. FIG. 2 includes in the view the circuit board 24 which can be located between the base portion 18 and the louvered heatsinking element 20. The louvered heatsinking element 20 preferably has a peripheral portion 21 that surrounds a central region 22, wherein the central region 22 can be contoured toward the heatsink 11 and the central region is aligned with the heatsink 11 and is in thermal contact with the heatsink 11. The expression "central" can mean that the region is exactly centered or substantially center, but also is intended to imply that the component is not at an edge and is surround by some other region. As shown in FIG. 2, the peripheral portion 21 is preferably raised and that the louvers are directed 23 in a plurality of directions to enhance the distribution of heat. In FIG. 2, there are louvers 23 directed toward the back, front, left and right of the set-top box.

Figure 3:
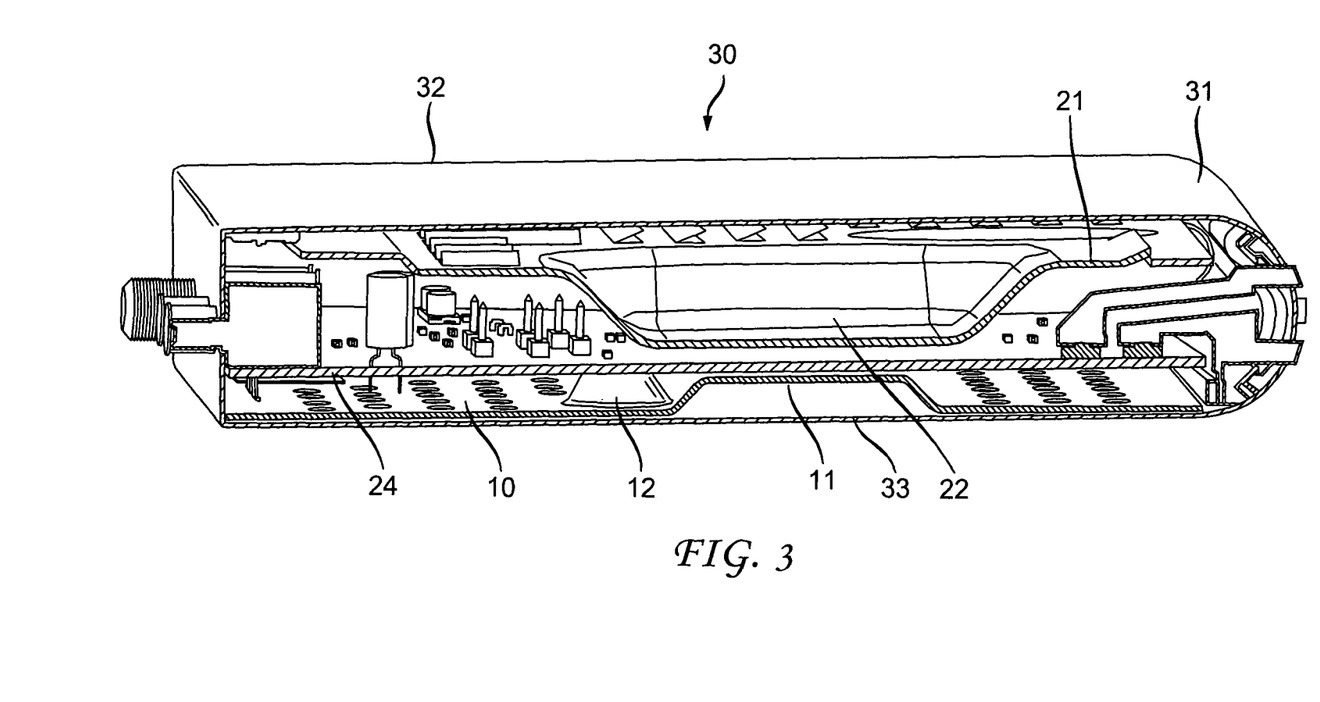
FIG. 3 shows an interior view of an assembled set-top box 30 according to the invention.

FIG. 3 shows a perspective cross sectional view of an assembled set-top box 30 according to an embodiment of the invention. FIG. 3 shows the outer casing 31. In particular, FIG. 3 shows how the interior bottom frame, circuit board 24, and louvered heatsinking element 20 are positioned between the top portion 32 and bottom portion 33 of the outer casing 31. This view further shows the central region 22 being in thermal contact with the heatsink 11 through the circuit board 24.

Figure 4:
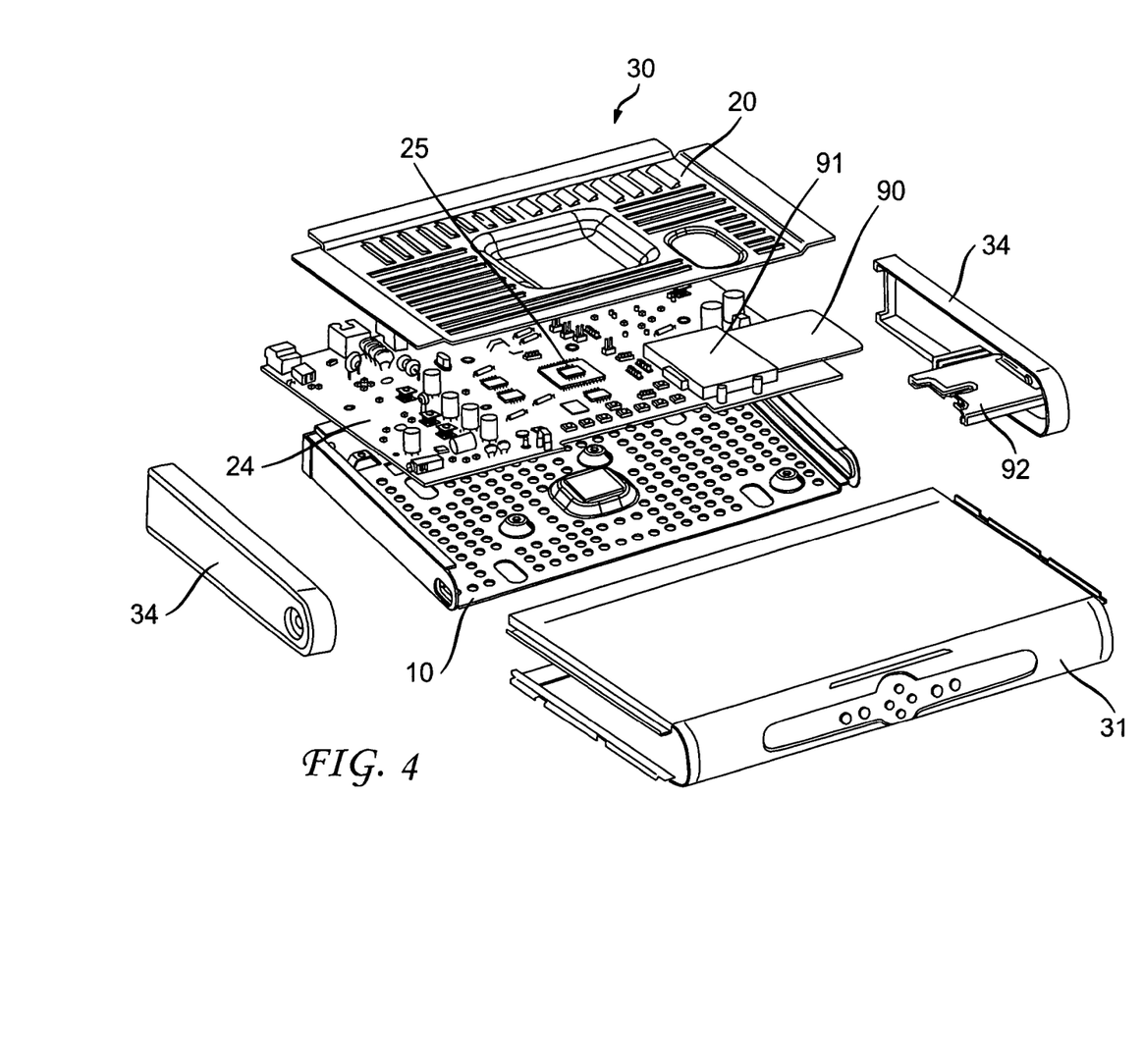
FIG. 4 is a disassembled view of the major components of the set-top box 30 according to the invention.

FIG. 4 is a disassembled view of the major components of the set-top box 30 according to an embodiment of the invention. This view also shows how the interior bottom frame, circuit board 24, and louvered heatsinking element 20 can be positioned with the outer casing 31. Ideally, the set-top box according to the invention is assembled as follows: (1) assembling and connecting the interior bottom frame 10, circuit board 24, and louvered heatsinking element 20 together; (2) inserting this assembly into the outer casing 31; and (3) locking the entire assembly shut with end caps 34 that snap on to the sidewalls 19 of the bottom frame 10.

FIG. 4 also shows the circuit board 24 having a thermal contact 25. This thermal contact 25 can be in contact with the central region 22 of the louvered heatsink element 20 and the heatsink 11 of the bottom frame 10. The thermal contact 25 also assists in extracting heat directly from the circuit board 24. Optionally, the circuit board 24 can have a central hole that can permit the central region 22 and the heatsink 11 to contact directly.

FIG. 4 also shows that the set-top box 30 can have a smart card reader 91 on the circuit board 24 and a smart card entry slot 92 in an end cap 34 for a smart card 90.

Figure 5:
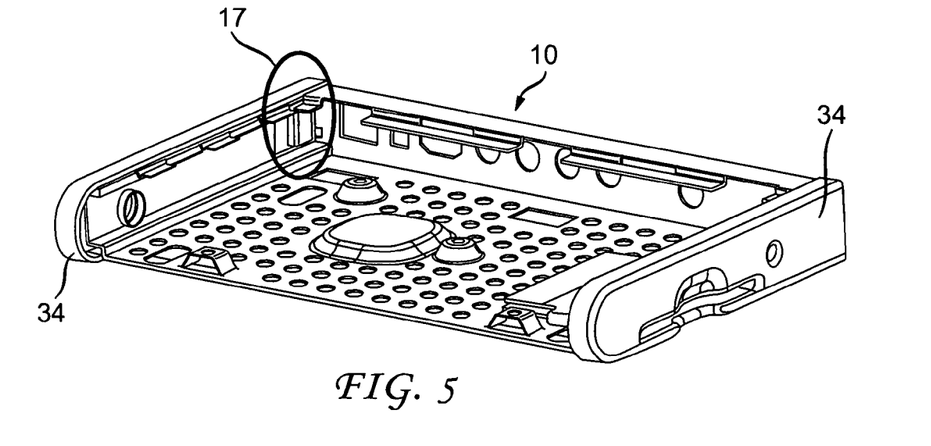
FIG. 5 is a view of interior bottom frame 10 with end caps 34 engaged.

FIGS. 5 and 6 provide views showing how the end caps 34 lock the entire assembly or complete the set-top box 30. FIG. 5 particularly shows how the bottom frame 10 and end caps 34 engage to the complete the set-top box. The outer casing 31 and other components are not shown in FIGS. 5 and 6 to simplify the engage mechanism. However, in an assembled device the left and right end caps 34 ideally fit tightly over and around the corresponding peripheral edges of the outer casing 31.

Figure 6A:
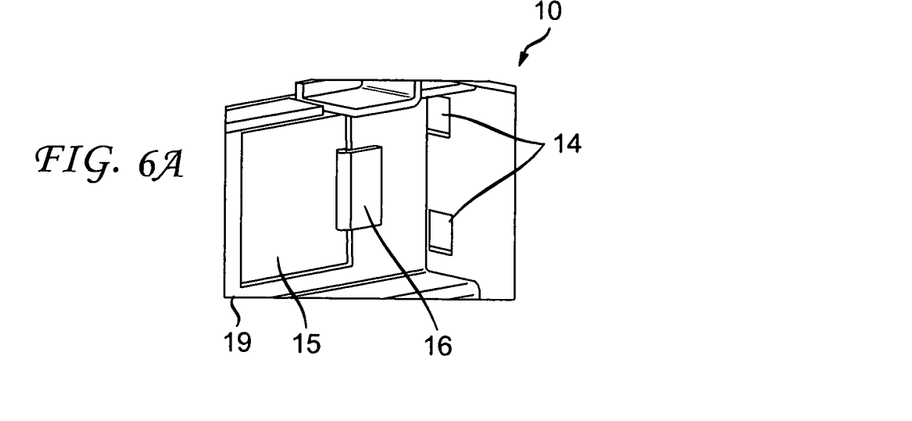
FIG. 6 shows a series of a magnified views of the corner 17 of the interior bottom frame 10 exhibiting how the end caps 34 are engaged.
Figure 6B:
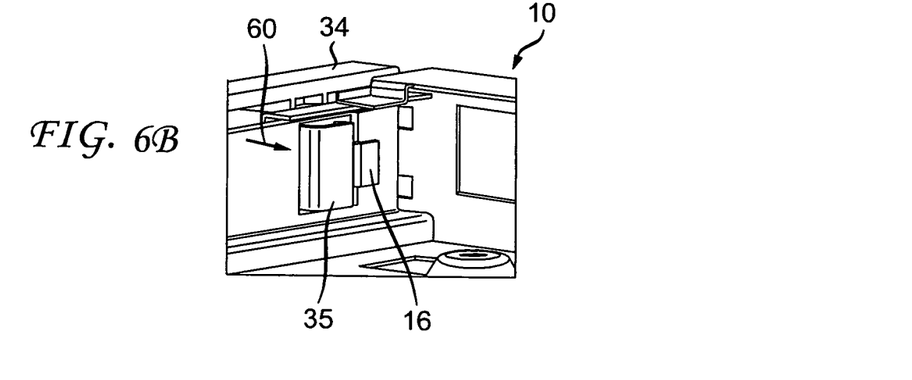
Figure 6C:
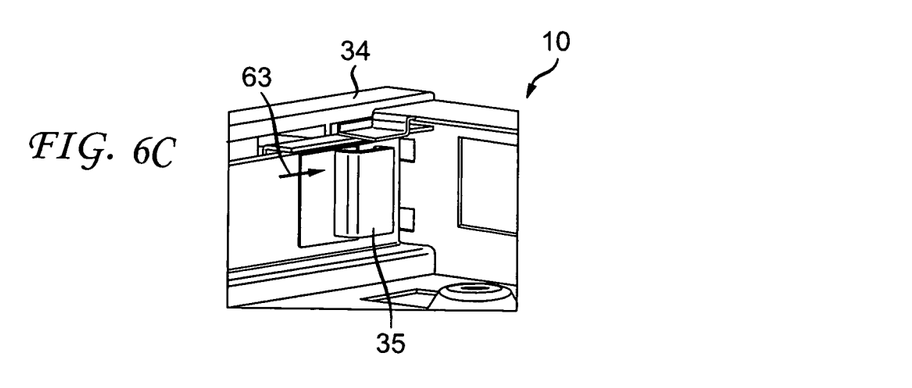

The corner section 17 in FIG. 5 of the bottom frame with the locking mechanism is shown in FIG. 6A. FIG. 6A particularly shows the sidewall 19, the sidewall aperture 15 and sidewall clasps 16 adjacent to the aperture 15. The clasps 16 are preferably located on the interior side of the sidewall 19. FIG. 6B shows the application of the end cap 34 to the sidewall 19, wherein the end cap 34 has an engagement member 35 on the interior side of the end cap 34 which inserts through the sidewall aperture 15 in an inwardly motion 60. FIG. 6C then shows the end cap 34 being slid in a rearwardly motion 63 such that engagement member 35, which preferably has an engagement hook, engages and elastically snaps into the sidewall clasps 16, thereby locking the end caps 34 onto the bottom frame 10. Not shown in the figures is the feature of the end caps 34 also engaging the sidewalls and/or the outer casing 31 away from the rear of the set-top 30 to ensure that end caps are along the length of the sidewall 19.

Figure 7:
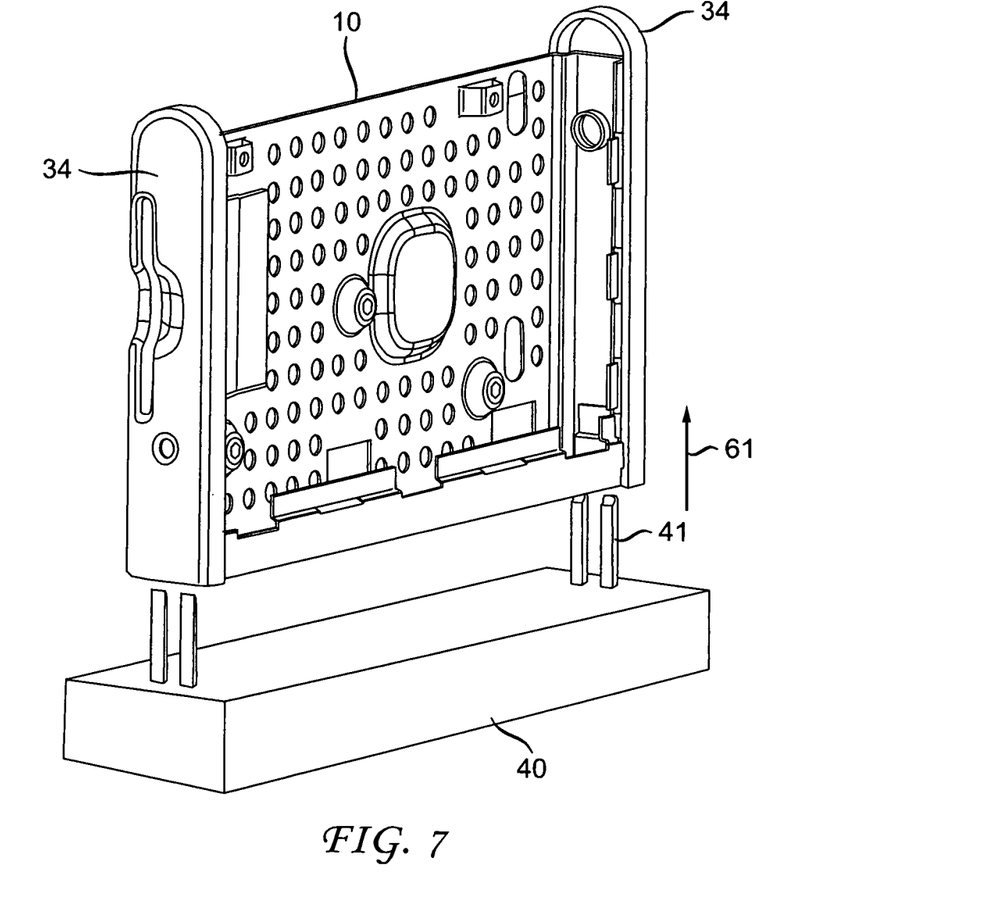
FIG. 7 is a view of the application a disengagement tool 40 on the set-top box according to the invention.
Figure 8A:
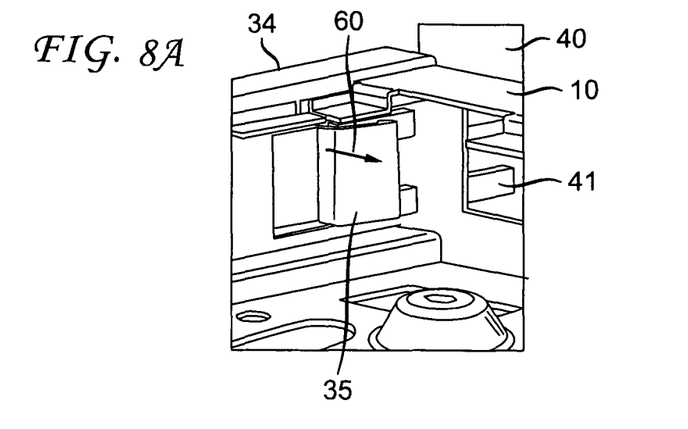
FIG. 8 shows is a series of a magnified views of the corner 17 of the interior bottom frame exhibiting how the end caps are disengaged.
Figure 8B:
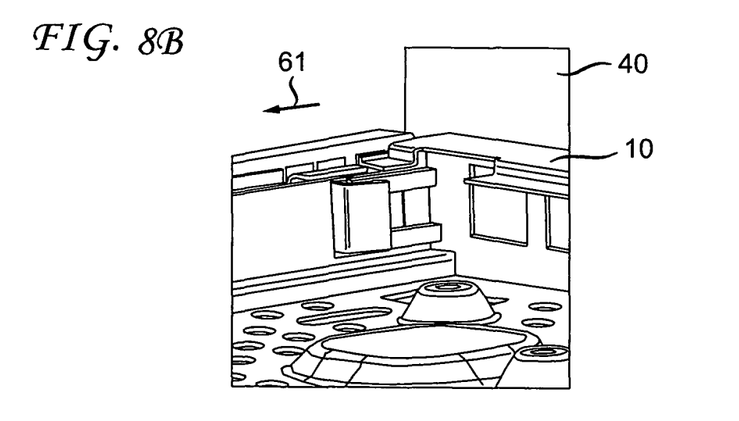
Figure 8C:
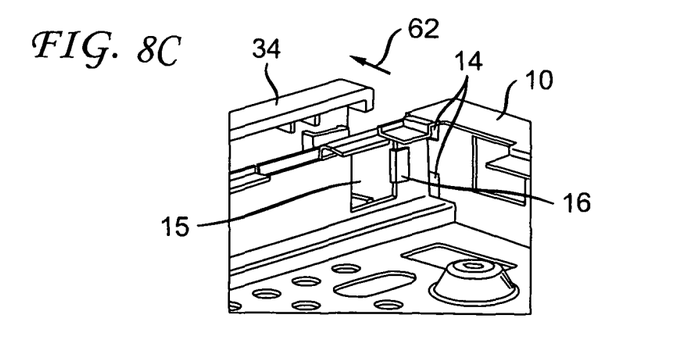

FIGS. 7 and 8 provide additional views showing how the end caps 34 can be unlocked to disassemble the set-top box 30 for maintenance, diagnostics, or electronic component upgrading. As shown in FIG. 7, an embodiment of the invention is the feature of the set-top 30 requiring disengagement tool 40 to disassemble the set-top box 30. This helps to ensure that the set-top box 30 will only be dissembled by a qualified technician in possession of the tool 40. Regarding the tool 40, it has unlocking prongs 41 which are inserted into unlocking apertures 14 on the rearwall 19r of the bottom frame 10 in a forward motion 61 as shown in FIG. 7. This forward motion 61 causes the unlocking prongs 41 to wedge between the interior of sidewall 19 and the engagement member 35 causing the engagement member 35 to flex in an inwardly motion 60. The unlocking prongs 41 are preferably in pairs and configured to clear the sidewall clasps 16 and have the sidewall clasps be between the pair as shown in FIG. 8B. FIG. 8B also shows that with the engagement member 35 flexed inwardly the end caps 34 can be slid in a forward motion 61. This allows the engagement member 35 to align with the sidewall aperture 15 such that the end caps 34 can be removed in an outwardly motion 62 as shown in FIG. 8C and removed, thereby opening the assembly.

Figure 9A:
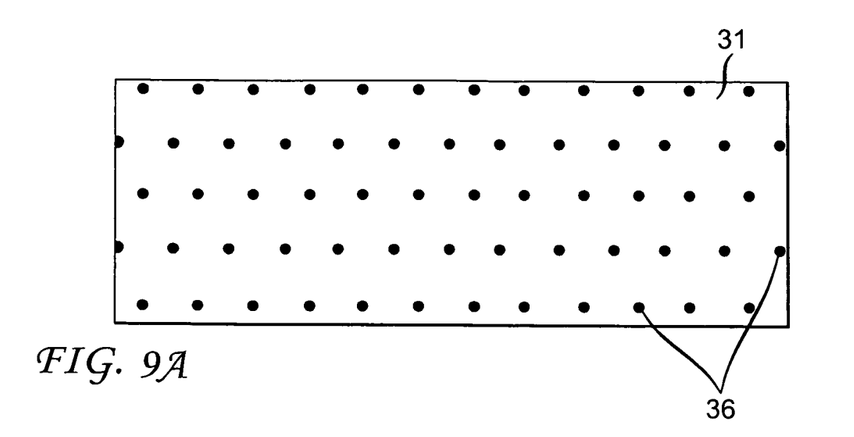
FIG. 9 shows the microperforation feature of the outer casing.
Figure 9B:
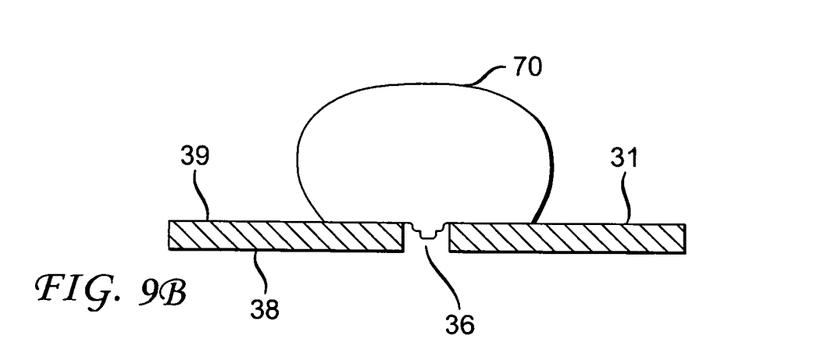
Figure 9C:
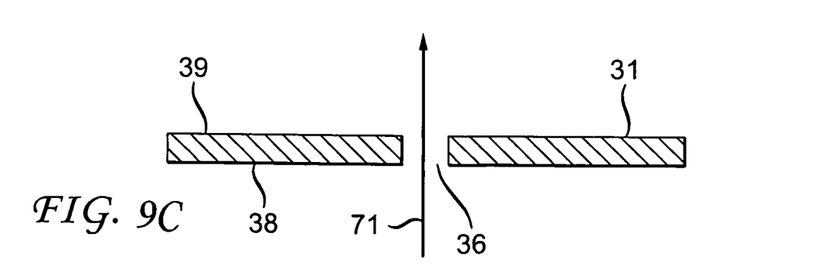

FIG. 9A shows the additional feature of microperforations 36 in the outer casing 30 which enable heat to escape and yet prevents insects and liquids from entering the set-top box 30. FIG. 9B shows how liquids 70 pool on the exterior side 39 of the outer casing 31 at the microperforations and do not enter the set-top box 30. FIG. 9C shows how heat 71 is permitted to escape from the interior side 38 through the microperforations 36 to the exterior side 39 of the set-top box 30. The design achieves the goal of dissipating the entire wattage of energy throughout the integrated assembly without causing the exterior side 39 of the outer casing 30 to go beyond desired temperatures. Furthermore, although the invention can work in concert with a fan, in an preferred embodiment there are no fans in the set-top 30 and no fans are required.

Optimally, the material of the outer casing 31 should be sized such that the intended benefits can be achieved with a preference for the diameters of the holes being no greater than 1 mm and preferably in the range of 0.5 to 1 mm. Although the optimum shape of the microperforation is circular, the other shapes are within the scope of the invention, wherein the optimum size is to have the longest dimension being 1 mm or less and/or and the shortest dimension being 0.5 or greater.

In sum, the invention provides a number of advantages. It first of all provides a barrier that utilizes the natural phenomenon of surface tension to resist liquid entry. This barrier further prevents infestation or entrance of any other foreign objects or matter. Additionally, the invention provides for a breathable or porous outer casing that allows heat to be removed.

It should be understood that in a preferred embodiment the only openings into the interior of the set-top box are the microperforations. As such, it should be understood that where there are other apertures shown such as the unlocking apertures 14 that there are appropriate leak tight seals or barriers to prevent liquids or insects from entering the interior. As such, a feature of the invention is the engagement members 35 abut the rearwall 19r which has the unlockling apertures in a manner that prevents any clearance for liquids or insects into the interior.

Figure 10:
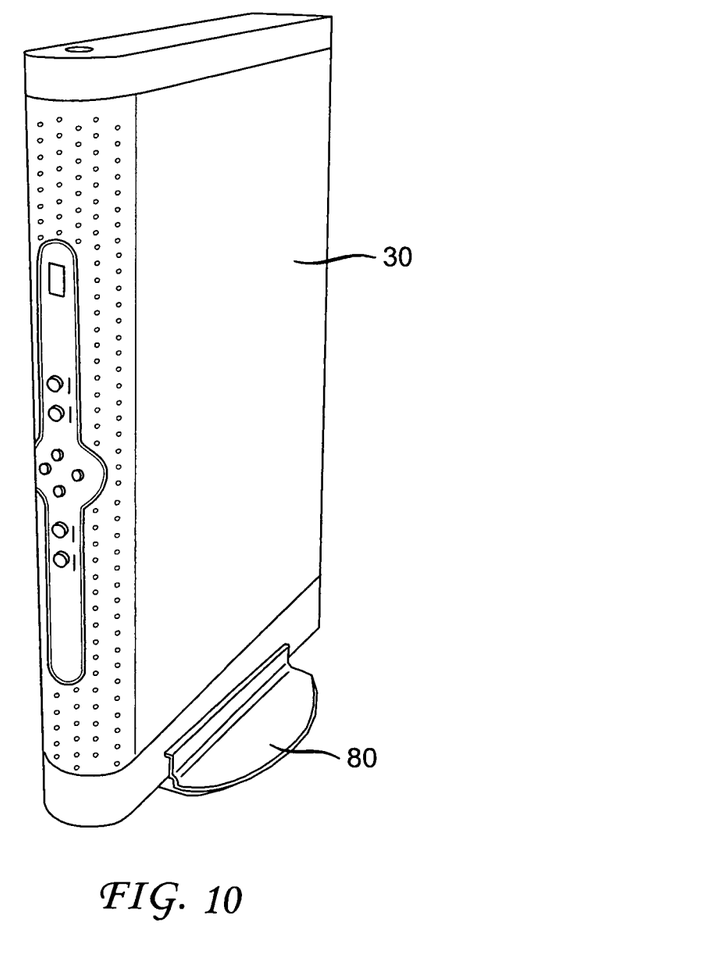
FIG. 10 shows a view of the set-top box 30 in a vertical orientation.

An additional feature of the invention is that the set-top box 30 can be vertically mounted on a base stand 80 as shown in FIG. 10 such that the set-top box 30 has one of the sidewalls 19, 19s, 19r parallel to the ground. The benefit to this feature is that the vertical orientation can facilitate more rapid heat escape. Furthermore, the vertical orientation can permit the set-top 30 to be hidden or placed in a greater variety of locations.

It should be understood that although examples of the claimed inventions specifically mention set-top boxes and circuit boards, the invention is not limited to these features. For example, the invention is applicable to computers and other electronic devices having heat generating components. Furthermore, the invention is also applicable to electronic parts other than circuit boards which can generate heat.

What is claimed is:

1. An electronic device comprising:
    an outer casing having a top and a bottom, said outer casing having heat venting perforations;
    a bottom frame inside said outer casing, said bottom frame having a heatsink surrounded by a peripheral area;
    an interior electronic component over the bottom frame; and
    a heatsinking element over the interior electronic component, said heatsinking element having a central region in thermal contact with the heatsink and having a peripheral portion, said peripheral portion having louvers, wherein said heatsinking element is under the top.

2. The electronic device of claim 1 wherein the perforations have an opening dimension of at most 1 mm.

3. The electronic device of claim 1 wherein the perforations have an opening dimensions within the range of 0.5 to 1 mm.

4. The electronic device of claim 1 wherein the heatsink is raised with respect to the peripheral area.

5. The electronic device of claim 4 wherein the central region is depressed with respect to the peripheral portion.

6. The electronic device of claim 5 wherein the perforations have an opening size of no greater than 1 mm.

7. The electronic device of claim 5 wherein the perforations have an opening size in the range of 0.5 to 1 mm.

8. The electronic device of claim 5 wherein there are at least four louvers of the louvers oriented each oriented in different directions.

9. The electronic device of claim 8 wherein the perforations have an opening dimensions within the range of 0.5 to 1 mm.

10. The electronic device of claim 5 further comprising a base stand, wherein a sidewall of the bottom frame is positioned in the stand such that the top and the bottom of the outer casing are oriented vertically.

11. The electronic device of claim 10 wherein the perforations have an opening dimensions within the range of 0.5 to 1 mm.

12. The electronic device of claim 1 wherein the central region is depressed with respect to the peripheral portion.

13. The electronic device of claim 1 wherein the interior electronic component is a circuit board and has a thermal contact region that permits the heatsink and central region to be in thermal contact.

14. The electronic device of claim 1 wherein at least one louver of the louvers is oriented in one direction and at least one other louver of the louvers is oriented in another direction.

15. The electronic device of claim 1 wherein the peripheral area has at least one aperture.

16. The electronic device of claim 1 wherein
    the bottom frame has two opposing sidewalls each having openings and clasps adjacent said openings; and
    the electronic device further comprises end caps having engagement members that engage the clasps through said openings, thereby locking the end caps to the bottom frame.

17. The electronic device of claim 16 wherein
    the clasps are narrower than the engagement members along a vertical dimension; and
    the bottom frame has a rear wall having unlocking apertures adapted to permit unlocking prongs to enter therethrough and release the engagement members from the clasps, thereby permitting the ends caps to be unlocked from the bottom frame.

18. The electronic device of claim 17 wherein there are at least four louvers of the louvers oriented each in different directions.

19. The electronic device of claim 17 wherein the electronic device has no fan.

20. The electronic device of claim 1 wherein there are at least four louvers of the louvers oriented each in different directions.

* * * * *